(12) United States Patent
Ahn et al.

(10) Patent No.: US 10,714,638 B2
(45) Date of Patent: Jul. 14, 2020

(54) OPTOELECTRONIC MODULES AND METHODS FOR MANUFACTURING THE SAME

(71) Applicant: AMS SENSORS SINGAPORE PTE. LTD., Singapore (SG)

(72) Inventors: Tae Yong Ahn, Singapore (SG); Sai Mun Chan, Singapore (SG); Kyu Won Hwang, Singapore (SG)

(73) Assignee: ams Sensors Singapore Pte. Ltd., Singapore (SG)

( * ) Notice: Subject to any disclaimer, the term of this patent is extended or adjusted under 35 U.S.C. 154(b) by 0 days.

(21) Appl. No.: 15/868,081

(22) Filed: Jan. 11, 2018

(65) Prior Publication Data

US 2018/0204959 A1 Jul. 19, 2018

Related U.S. Application Data

(60) Provisional application No. 62/445,847, filed on Jan. 13, 2017.

(51) Int. Cl.
| | | |
|---|---|---|
| *H01L 31/0203* | (2014.01) | |
| *H01L 33/48* | (2010.01) | |
| *H01L 31/0232* | (2014.01) | |
| *H01L 27/15* | (2006.01) | |
| *H01L 33/00* | (2010.01) | |
| *H01L 27/146* | (2006.01) | |

(Continued)

(52) U.S. Cl.
CPC .... *H01L 31/0203* (2013.01); *H01L 27/14618* (2013.01); *H01L 27/14625* (2013.01); *H01L 27/15* (2013.01); *H01L 31/0232* (2013.01); *H01L 31/02325* (2013.01); *H01L 31/18* (2013.01); *H01L 33/005* (2013.01); *H01L 33/483* (2013.01); *H01L 33/58* (2013.01)

(58) Field of Classification Search
CPC ... H01L 31/0203; H01L 33/483; H01L 33/58; H01L 31/0232; H01L 27/15; H01L 33/005; H01L 27/14618; H01L 27/14625; H01L 31/18; H01L 31/02325; H01L 27/14683; H04N 5/2251; H04N 5/2257; H04N 5/2254; Y10T 29/49002
USPC ...... 348/374, E5.024, 164, 65; 257/E31.117, 257/E31.127, E5.027
See application file for complete search history.

(56) References Cited

U.S. PATENT DOCUMENTS

| | | | |
|---|---|---|---|
| 9,768,631 B2 | 9/2017 | Riel et al. | |
| 2010/0208132 A1* | 8/2010 | Shiraishi | ........... H01L 27/14618 348/374 |

(Continued)

*Primary Examiner* — Mouloucoulaye Inoussa
(74) *Attorney, Agent, or Firm* — Michael Best and Friedrich LLP

(57) ABSTRACT

Optoelectronic modules, such as imaging cameras, proximity sensors, range cameras, structured-light/pattern generators, and image projectors, and methods for their manufacture, are disclosed. The optoelectronic modules exhibit particularly small dimensions. The optoelectronic modules include an optical assembly, an intermediate substrate, and a base substrate. The optical assembly includes a flange portion. An adhesive layer between the flange portion and the intermediate substrate, and an additional adhesive layer between the intermediate substrate and the base can be substantially non-transmissive to light and can resist dimensional changes dues to moisture absorption, for example.

14 Claims, 9 Drawing Sheets

(51) Int. Cl.
*H01L 31/18* (2006.01)
*H01L 33/58* (2010.01)

(56) References Cited

U.S. PATENT DOCUMENTS

2014/0252522 A1* 9/2014 Miyazaki ......... H01L 27/14605
257/432
2017/0012069 A1 1/2017 Rudmann et al.

* cited by examiner

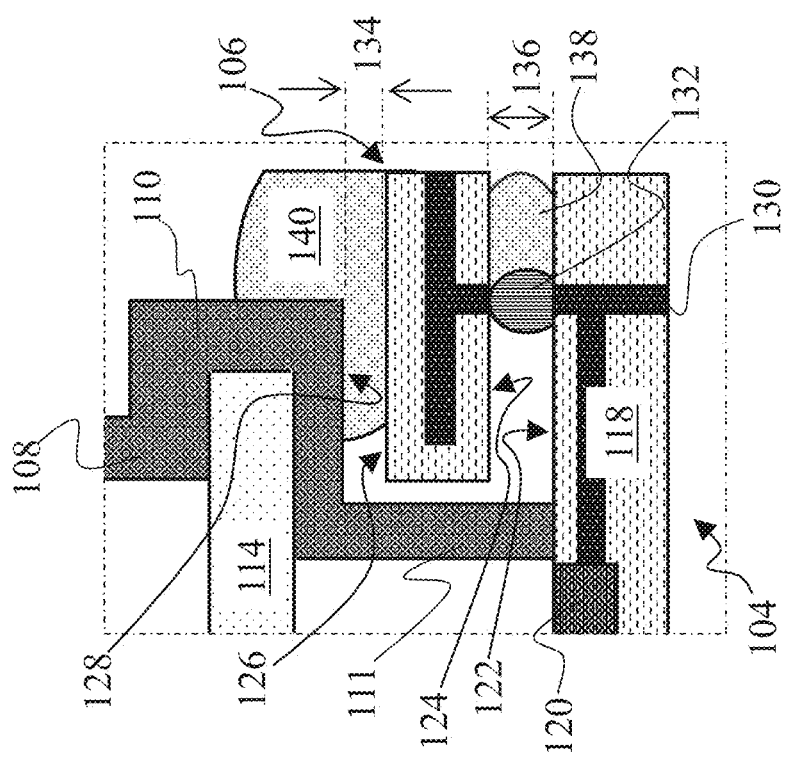
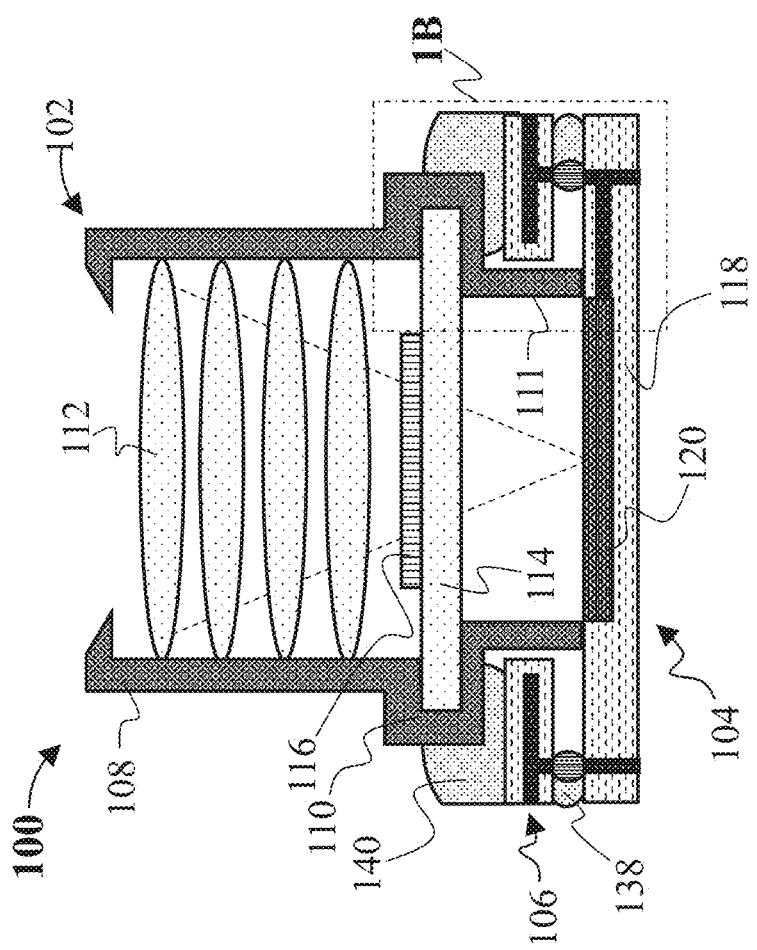
FIG. 1A
FIG. 1B

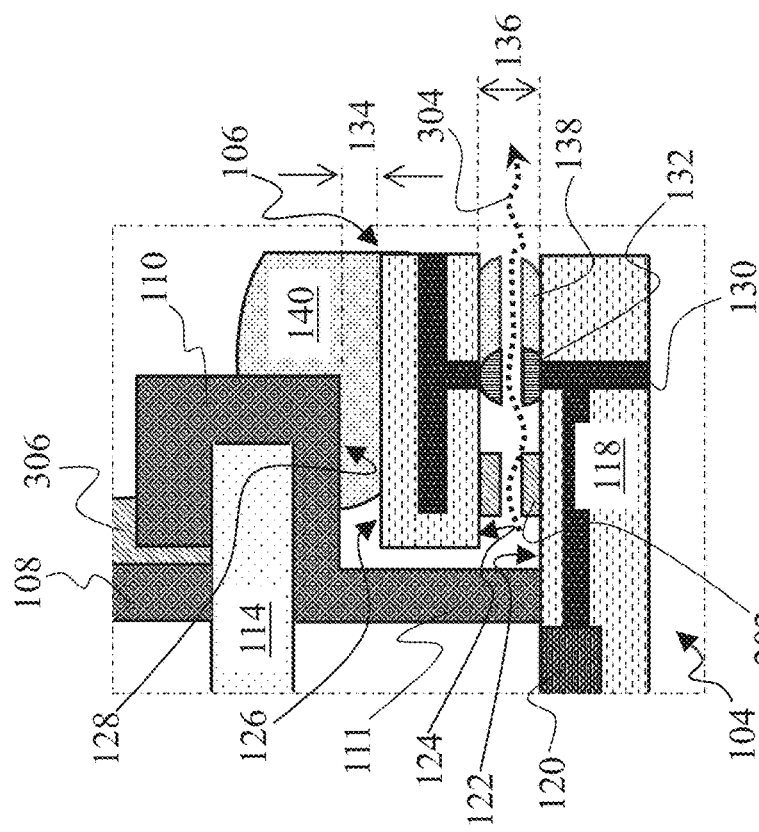
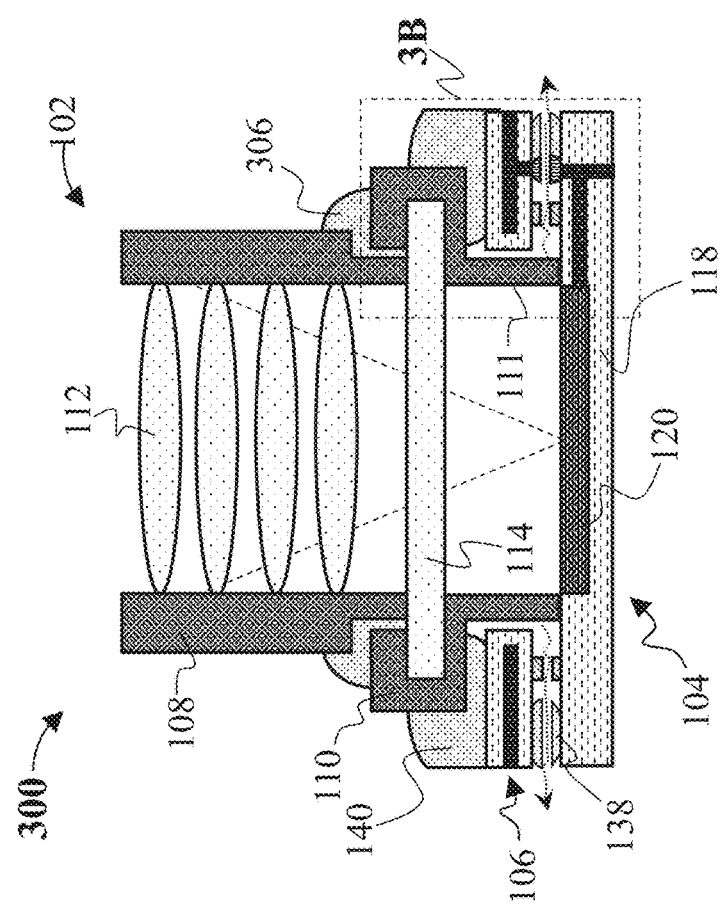

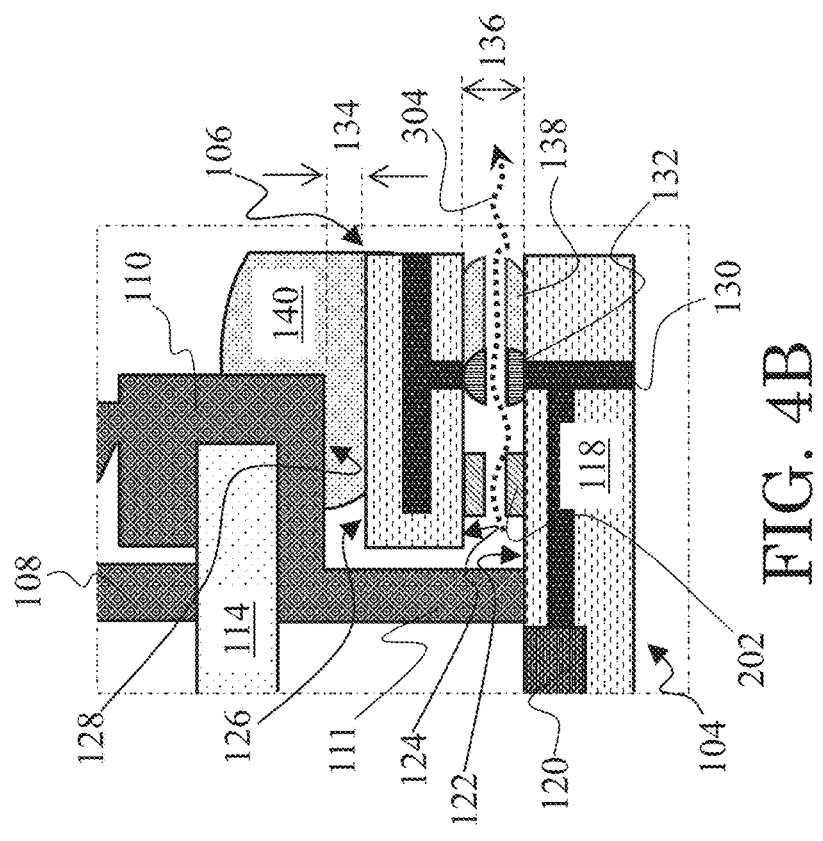
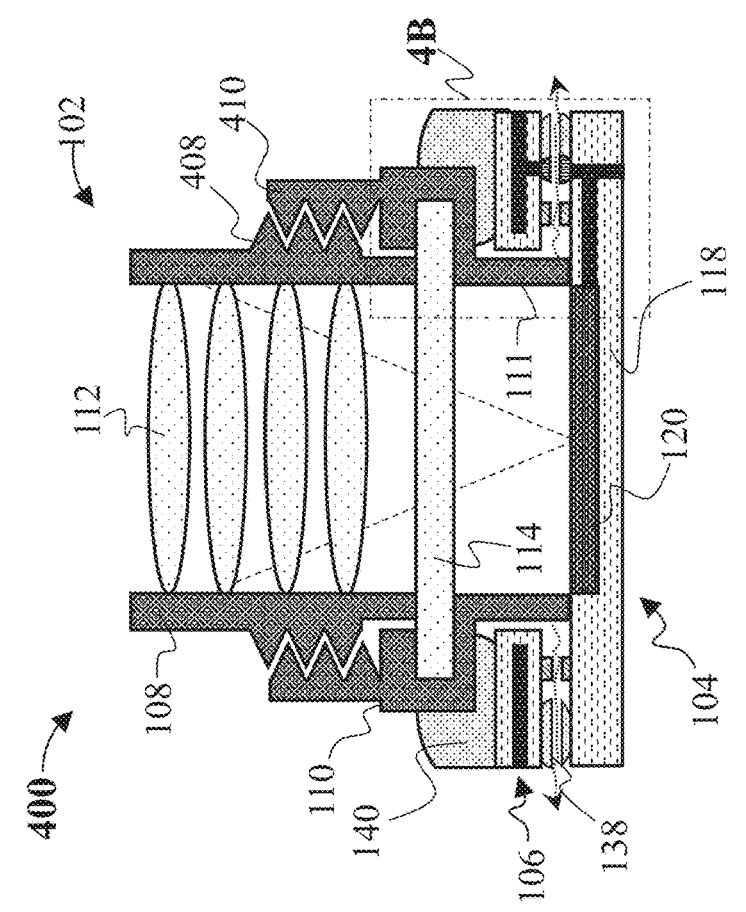
FIG. 4A
FIG. 4B

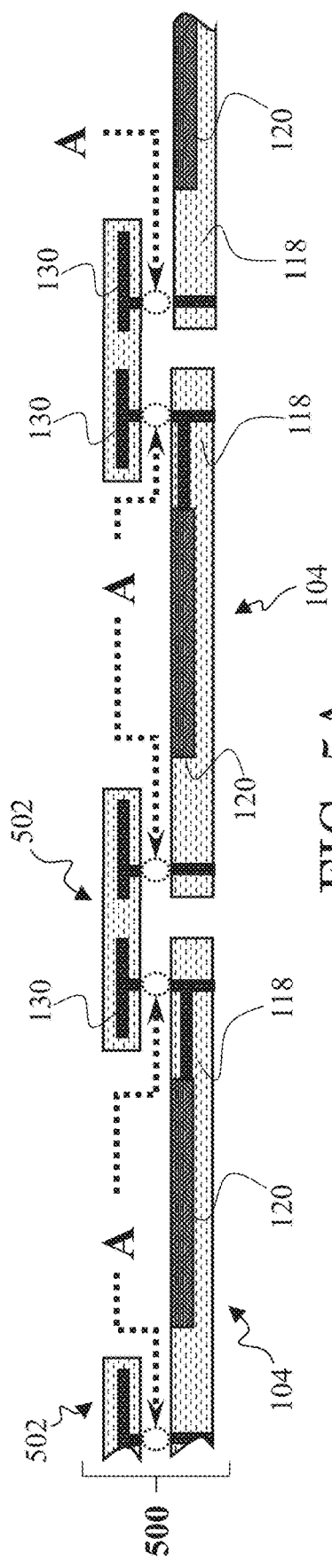
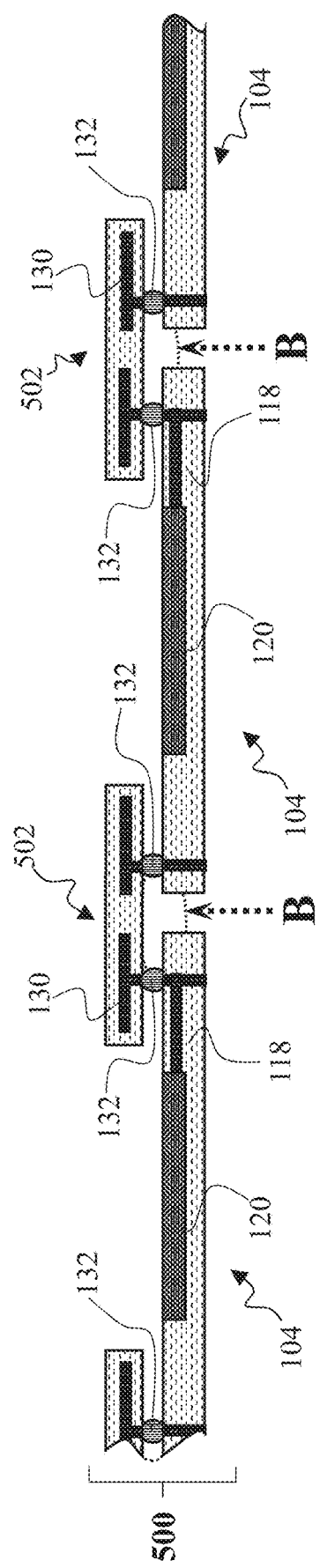
FIG. 5A
FIG. 5B

OPTOELECTRONIC MODULES AND METHODS FOR MANUFACTURING THE SAME

CROSS-REFERENCE TO RELATED APPLICATION(S)

This application claims the benefit of priority of U.S. Provisional Patent Application No. 62/445,847, filed on Jan. 13, 2017, the contents of which are incorporated by reference herein in their entirety.

FIELD OF THE DISCLOSURE

The present disclosure relates to optoelectronic modules and methods for manufacturing them.

BACKGROUND

Optoelectronic modules such as imaging cameras, proximity sensors, and range cameras include at least one optical element aligned to an active optoelectronic component (i.e., a component that either generates or is sensitive to a particular wavelength or range of electromagnetic radiation). The active optoelectronic component typically includes a photodiode or an array of photodiodes; a complementary metal oxide semiconductor (CMOS) or charge-coupled device (CCD) image sensor; or a laser diode or an array of laser diodes, such as a vertical surface-emitting laser (VCSEL) array. The at least one optical element (e.g., a refractive element, diffractive element, or microlens array) may be mounted within an optical housing. Moreover, the optical housing may be mounted to the active optoelectronic component, thereby providing a mechanical connection between the at least one optical element and the active optoelectronic component.

This broad class of optoelectronic modules can be integrated into myriad host devices ranging from portable electronic devices (e.g., smartphones, tablet computers, laptops, wearable electronics) to desktop computers and automotive systems. In many instances, the dimensions of these modules often strongly affect the dimensions of the host devices into which they are integrated.

For example, various components within an optoelectronic module, including an optical housing, can be aligned and mounted to an active optoelectronic component using a layer of adhesive. Typically, a significant amount of adhesive is used to provide a reliable mechanical connection and, in some cases, to provide a barrier to electromagnetic radiation, such as the particular range of electromagnetic radiation to which the active optoelectronic component is sensitive or operable to generate. In some instances, the adhesive layer also can isolate the active optoelectronic component from foreign matter, such as dust particles or humid air. Although the adhesive layer is effective, it is a viscous substance prior to curing and therefore tends to spread (e.g., onto sensitive areas of the active optoelectronic component). An adhesive overflow region may be incorporated into the optoelectronic module in the immediate vicinity of the active optoelectronic component to contain spreading adhesive thereby increasing the overall footprint (i.e., the x-, y-dimensions) of the optoelectronic module. Consequently, the dimensions of the host device into which the optoelectronic module is integrated are increased to accommodate the adhesive overflow region.

In addition to increasing the overall footprint of the optoelectronic module, the adhesive layer can cause additional problems. For example, the adhesive layer can absorb moisture after curing which tends to result in expansion. As the adhesive layer typically provides the mechanical connection between the active optoelectronic component and the optical housing (including the at least one optical element), moisture absorption can cause the active optoelectronic component and the at least one optical element to become misaligned. This effect is particularly pronounced for modules having thick adhesive layers.

A solution is needed that combines the functions of the adhesive layer as described in part above, but that does not significantly increase the footprint of the optoelectronic module and additionally resists misalignments due to moisture absorption.

SUMMARY

This disclosure describes optoelectronic modules that, in some cases, can overcome the problems described above.

In one aspect, for example, an optoelectronic module includes an optical assembly, an active optoelectronic component assembly, and an intermediate substrate disposed therebetween. The optical assembly includes an optical housing portion, a flange portion, and an optical alignment spacer disposed therebetween. The optical assembly includes at least one optical element, such as a diffractive or diffractive optical element, or a microlens array. In some instances, the optical assembly further includes a cover glass. In some instances, the optical assembly further includes a supplemental optical element, such as a bandpass filter, disposed on a surface of the cover glass.

In some implementations, the optoelectronic module further includes at least one tilt correction spacer. In some instances, the at least one tilt correction spacer includes at least a venting channel.

The optical housing portion includes at least one optical element disposed therein. The active optoelectronic component assembly includes a base substrate and an active optoelectronic component disposed on a first side of the base substrate. The active optoelectronic component includes a light-emitting component or a light-sensitive component. For example, the active optoelectronic component can include a photodiode or an array of photodiodes; a complementary metal oxide semiconductor (CMOS) or charge-coupled device (CCD) image sensor; or a light-emitting diode, a laser diode or an array of laser diodes, such as a vertical surface-emitting laser (VCSEL) array. In some instances, the active optoelectronic component assembly further include a supplemental optical element, such as a bandpass filter, disposed on the active optoelectronic component.

The intermediate substrate includes first and second sides, and the flange portion includes a first side. The first side of the intermediate substrate is disposed opposite the first side of the base substrate and is separated by a base gap. The second side of the intermediate substrate is disposed opposite the first side of the flange portion and is separated by a flange gap. In some instances, the optical housing portion is fixed to the flange portion by a supplemental adhesive. In some instances, the optical housing portion is fixed to the flange portion by threaded portions, the threaded portions being operable to actuate the optical housing portion to align the optical assembly with the active optoelectronic component.

The active optoelectronic component assembly and the intermediate substrate include electrical components in electrical communication via at least one electrical connection disposed within the base gap. In some instances, the at least one electrical connection is a soldered connection (e.g., a solder bump). The at least one electrical connection can be operable to delineate the base gap. In some instances, the at least one electrical connection includes a venting channel to permit gasses to pass to, or away from, the active optoelectronic component assembly.

In some instances, the electrical components is included in the base substrate and/or the active optoelectronic component. In some instances, the electrical components is located in the intermediary substrate such that the base substrate can be substantially thinner than would otherwise be the case. The electrical components can include, for example, electrical conduits (e.g., vias), capacitors, resistors, dielectrics, bonding pads, and electronic circuitry such as integrated circuits.

The optoelectronic module further includes a base adhesive layer that at least partially occupies the base gap. The base adhesive layer is operable to fix the active optoelectronic component assembly to the intermediate substrate. The optoelectronic module further includes a flange adhesive layer that at least partially occupies the flange gap. The flange adhesive layer is operable to fix the optical assembly to the intermediate substrate. In some instances, the flange gap and the base gap are configured to contain the flange adhesive and the base adhesive, respectively, such that neither the flange adhesive nor the base adhesive impinge onto the active optoelectronic component.

In some implementations, the optical alignment spacer is in contact with the first side of the base substrate and is operable to align the optical assembly and the active optoelectronic component, and is further operable to delineate the flange gap.

This disclosure further describes methods for manufacturing optoelectronic modules that, ins some instance, overcome the problems described above. For example, in accordance with some implementations, the method includes:

aligning an intermediate substrate wafer to a plurality of active optoelectronic component assemblies and establishing a plurality of electrical connections therebetween, the electrical connection delineating a base gap between each active optoelectronic component assembly within the plurality and the intermediate substrate wafer;

introducing adhesive into each base gap;

aligning an optical assembly with each of the active optoelectronic component assemblies within the plurality, each optical assembly including an optical alignment portion and a flange portion;

contacting each optical alignment portion with a respective active optoelectronic component assembly such that the intermediate substrate wafer is disposed between each flange portion and each active optoelectronic component assembly, each optical alignment portion delineating a flange gap between each flange portion and the intermediate substrate wafer;

introducing adhesive into each flange gap; and dicing through the adhesive introduced into the flange gap, the intermediate substrate wafer, and the base gap.

In some implementations, the method further includes curing the adhesive introduced into the base gap and/or the adhesive introduced into the flange gap. Curing can be accomplished, for example, using thermal energy, electromagnetic radiation, or a combination of thermal energy and electromagnetic radiation.

In some implementations of the method, establishing the plurality of electrical connections includes soldering the plurality of electrical connections.

In some implementations of the method, dicing can occur before adhesive is introduced into the flange gap.

Except where specifically indicated, the foregoing operations need not occur in the order described, but may in some cases be performed in a different order, and in some cases, various operations may be performed simultaneously. Moreover, various features, components, or operations described in separate implementations may be combined in the same implementation. Other aspects, features and advantages will be readily apparent from the following detailed description, the accompanying drawings, and the claims.

BRIEF DESCRIPTION OF THE DRAWINGS

FIGS. 1A and 1B depict an example of an optoelectronic module.

FIGS. 3A and 3B depict an example of an optoelectronic module having vent channels.

FIGS. 4A and 4B depict an example of an optoelectronic module having threaded alignment portions.

FIGS. 5A-FIG. 5F depict an example of a method for manufacturing the optoelectronic module depicted in FIGS. 1A and 1B.

DETAILED DESCRIPTION

Figure 2B:
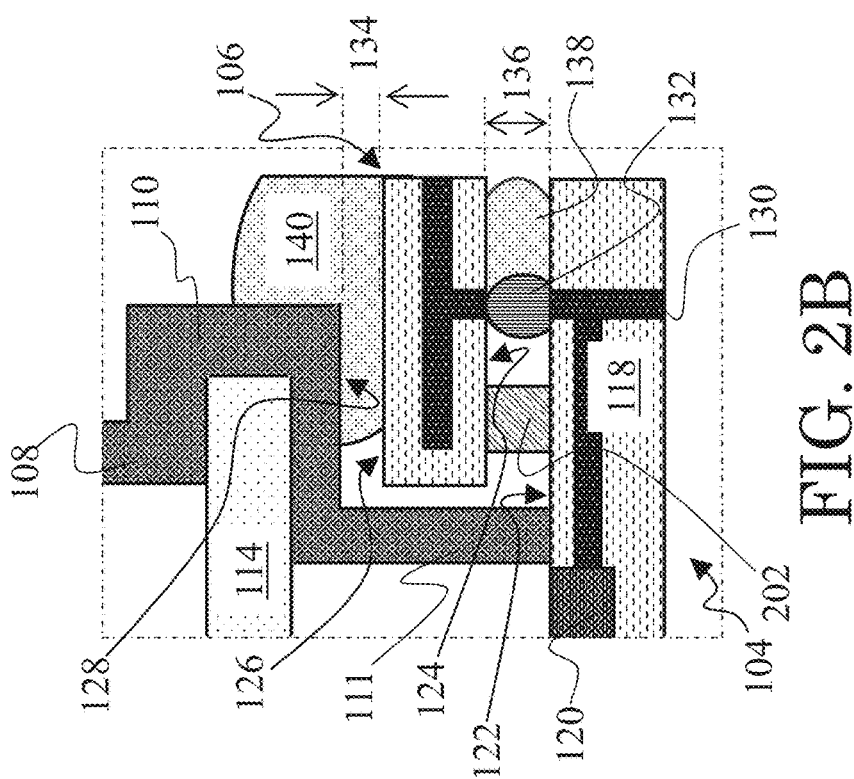
FIGS. 2A and 2B depict an example of an optoelectronic module having a tilt-correction spacer.

FIGS. 1A and 1B depict an example of an optoelectronic module 100 operable as an imaging camera, proximity sensor, range camera, structured-light/pattern generator, or an image projector, for example. The optoelectronic module 100 can be configured with a particularly small footprint (x, y dimensions), and in some implementation a particularly small height (z dimension), or both. The optoelectronic module 100 includes an optical assembly 102, an active optoelectronic component assembly 104, and an intermediate substrate 106 disposed therebetween. The intermediate substrate 106 can be a printed circuit board, for example, and can include electrical components 130. The electrical components can include, for example, electrical conduits (e.g., vias), capacitors, resistors, dielectrics, bonding pads, and electronic circuitry such as integrated circuits.

The optical assembly 102 includes an optical housing portion 108, a flange portion 110, and an optical alignment spacer 111 disposed therebetween. The optical assembly 102 can be composed, at least in part, of a polymer, such as an epoxy resin, and can be fabricated by injection molding, vacuum injection molding, film assisted molding, or by any other suitable mass fabrication means.

The optical housing portion 108, the flange portion 110, and in some cases, the optical alignment spacer 111, can be configured to be substantially non-transmissive to particular wavelengths of light. The optical housing portion 108 includes at least one optical element 112 disposed therein. The optical element 112 can be a refractive or diffractive lens element, or a microlens array, for example, depending on the intended function of the optoelectronic module 100. Further, the optical element 112 can be composed of any suitable material, such as optical resins, optical glasses, and so on. In some instances, the at least one optical element 112 can include a passive optical element, such as a bandpass filter.

In some instances, as depicted in FIGS. 1A and 1B, the optical assembly further includes a cover glass composed, at least in part, of an optically transparent material such as a polymer (e.g., an optical resin), an inorganic glass (e.g., flint glass), or a crystalline material (e.g., sapphire). In some instances, the optical assembly further includes a supplemental optical element 116 disposed on a surface of the cover glass. The supplemental optical element 116 can be a passive optical element, such as a bandpass filter (e.g., configured to block infrared and/or ultraviolet light), though it need not be. In some instances, for example, the supplemental optical element 116 is an active optical element, such as an electrochromic element.

The active optoelectronic component assembly 104 includes a base substrate 118 and an active optoelectronic component 120 disposed on a first side 122 of the base substrate 118. The base substrate 118 can be composed of a printed circuit board, and can include electrical components 130. The electrical components 130 can include, for example, electrical conduits (e.g., vias), capacitors, resistors, dielectrics, bonding pads, and electronic circuitry such as integrated circuits.

The active optoelectronic component 120 can include a light-emitting component or a light-sensitive component. For example, the active optoelectronic component can include a photodiode or an array of photodiodes; a complementary metal oxide semiconductor (CMOS) or charge-coupled device (CCD) image sensor; or a light-emitting diode, a laser diode or an array of laser diodes, such as a vertical surface-emitting laser (VCSEL) array. The active optoelectronic component 120 also also include other electrical components 130, for example, electrical conduits (e.g., vias), capacitors, resistors, dielectrics, bonding pads, and electronic circuitry such as integrated circuits.

The intermediate substrate 106 includes first and second sides 124, 126, respectively, and the flange portion 110 includes a first side 128. The first side 124 of the intermediate substrate 106 is disposed opposite the first side 122 of the base substrate 118, and is separated by a base gap 136. The second side 126 of the intermediate substrate 106 is disposed opposite the first side 128 of the flange portion 110, and is separated by a flange gap 134.

The active optoelectronic component assembly 104 and the intermediate substrate 106 include electrical components 130 in electrical communication via at least one electrical connection 132 disposed within the base gap 136. The at least one electrical connection 132 can include a soldered connection, such as a soldered bump. The at least one electrical connection 132 can be between electrical connections 130 in the intermediate substrate 106 and the electrical connections 130 in either (or both) the base substrate 118 and/or the active optoelectronic component 120. In some instances, for example, the electrical components 130 that would otherwise be located in the base substrate 118 (i.e., immediately adjacent to the active optoelectronic component) is located in the intermediate substrate 106, thereby enabling the base substrate to possess a particularly small thickness (thereby reducing the overall height of the optoelectronic module 100).

The optoelectronic module 100 further includes a base adhesive layer 138 at least partially occupying the base gap 136. In some instances, the base adhesive layer 138 extends circumferentially thereby forming a continuous annulus between the first side 122 of the base substrate 118 and the first side 124 of the intermediary substrate 106. The at least one electrical connection 132 is operable to delineate the base gap 136. The base adhesive layer 138 is operable to fix the active optoelectronic component assembly 104 to the intermediate substrate 106. Moreover, the base gap 136 and the base adhesive layer 138 preferably are configured (e.g., the viscosity of the base adhesive layer 138 and dimension of the base gap 136 are selected) such that the following features and benefits are realized:

1) The base adhesive layer 138 forms a contiguous layer (e.g., laterally surrounding the active optoelectronic component 120 via capillary forces present effectuated by the base gap 136. The contiguous layer can be effective to prevent stray light from impinging on the active optoelectronic component 120, and in some cases can prevent foreign matter (e.g., dust particles) from impinging on the active optoelectronic component 120.

2) The base adhesive layer 138 adopts a particularly thin dimension between the first side 122 of the base substrate 118 and the first side 124 of the intermediate substrate 106. Consequently, subsequent moisture absorption can result in only negligible expansion of the base adhesive layer 138 thereby mitigating or preventing misalignment of the optical assembly 102 and the active optoelectronic component 120.

3) Excessive adhesive can be drawn into the base gap 136 via capillary action such that excess adhesive does not impinge on the active optoelectronic component 120.

The optoelectronic module 100 further includes a flange adhesive layer 140 at least partially occupying the flange gap 134. In some instances, the flange adhesive layer 140 extends circumferentially thereby forming a continuous annulus between the second side 126 of the intermediary substrate 106 and the first side 128 of the flange portion 106. The optical alignment spacer 111 is in contact with the first side 122 of the base substrate 118 and is operable to align the optical assembly 102 and the active optoelectronic component 120, and is further operable to delineate the flange gap 134. The flange adhesive layer 140 is operable to fix the optical assembly 102 to the intermediate substrate. Moreover, the flange gap 134 and the flange adhesive layer 140 preferably are configured (e.g., the viscosity of the flange adhesive layer 140 and dimension of the flange gap 134 are selected) such that the following features and benefits are realized:

1) The flange adhesive layer 140 forms a contiguous layer (e.g., laterally surrounding the active optoelectronic component 120 via capillary forces present in the flange gap 134. The contiguous layer can be effective to prevent stray light from impinging on the active optoelectronic component 120, and in some cases, can prevent foreign matter (e.g., dust particles) from impinging on the active optoelectronic component 120.

2) The flange adhesive layer 140 adopts a particularly thin dimension between the second side 126 of the intermediate substrate 106 and the first side 128 of the flange portion 110. Consequently, subsequent moisture absorption can result in only negligible expansion of the flange adhesive layer 140 thereby mitigating or preventing misalignment of the optical assembly 102 and the active optoelectronic component 120.

3) Excessive adhesive can be drawn into the flange gap 134 via capillary action such that excess adhesive does not impinge on the active optoelectronic component 120.

Figure 2A:
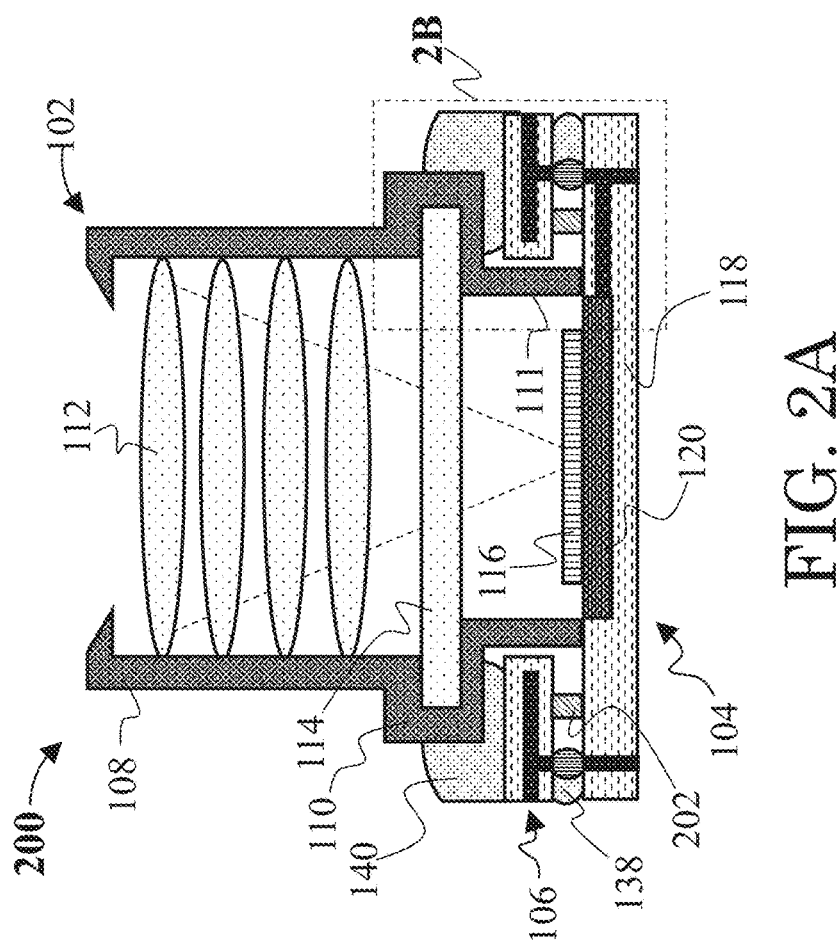

The various features and components described above can overcome problems exhibited by state of the art optoelectronic modules, such as the problems discussed above. Still other implementations are within the scope of this disclosure. For example, FIGS. 2A and 2B depict an example of an optoelectronic module 200 having a tilt-correction spacer 202. Unless specifically noted otherwise, components that share the same component number as the components of the example optoelectronic model 100 are the same such that the description of said components applies to the components depicted in FIGS. 2A and 2B. The optoelectronic module 200 includes the supplemental optical element 116 mounted on the active optoelectronic component 120. The supplemental optical element 116 can be a color filter array or an infrared filter, for example. The tilt correction spacer 202 can be configured to correct tilt inherent in the optical assembly 102, for example. In some instances, the tilt correction spacer 202 is machined to a predetermined dimension to correct the tilt inherent in the optical assembly 102. In some instances, the tilt correction spacer 202 has an additional, or entirely different function than tilt correction. Namely, in some instances, the tilt correction spacer 202 can delineate the base gap 136 analogous to the electrical connection 132 as described in the optoelectronic module 100 disclosed above. In such instances, the base gap 136 may be more precisely defined by the tilt-correction spacer 202 as compared to the electrical connection 132.

FIGS. 3A and 3B depict an example optoelectronic module 300 that includes venting channels as indicated by the dotted arrow 304. As above, unless specifically noted otherwise, components that share the same component number as the components of the example optoelectronic model 100 are the same such that the description of said components applies to the components depicted in FIGS. 3A and 3B. The venting channels 304 can traverse the tilt-correction spacer 202, the at least one electrical connection 132, and/or the base adhesive layer 138. The venting channels 304 can be configured to permit outgassing from the interior of the optoelectronic modules 300. For example, during operation the active optoelectronic component may generate heat. The heat generated may pass out of the venting channels 304. In addition, FIGS. 3A and 3B depict an alternative arrangement of the optical assembly 102. The optical housing 108 and the flange portion 110 are fixed to each other via supplemental adhesive 306. The supplemental adhesive 306 can be substantially non-transmissive to light.

FIGS. 4A and 4B depict another arrangement of the optical assembly 102. As above, unless specifically noted otherwise, components that share the same component number as the components of the example optoelectronic model 100 are the same such that the description of said components applies to the components depicted in FIGS. 4A and 4B. The optical housing 108 is fixed to the flange portion 110 via threaded portion 408, 410, respectively. The threaded portion 408, 410 permit the at least one optical element 112 to be adjusted relative to the active optoelectronic component 120. In such implementations, the optical assembly can be adjusted following final assembly in order to ensure precise alignment of the at least one optical element 112 and the active optoelectronic component 120.

Figure 5C:
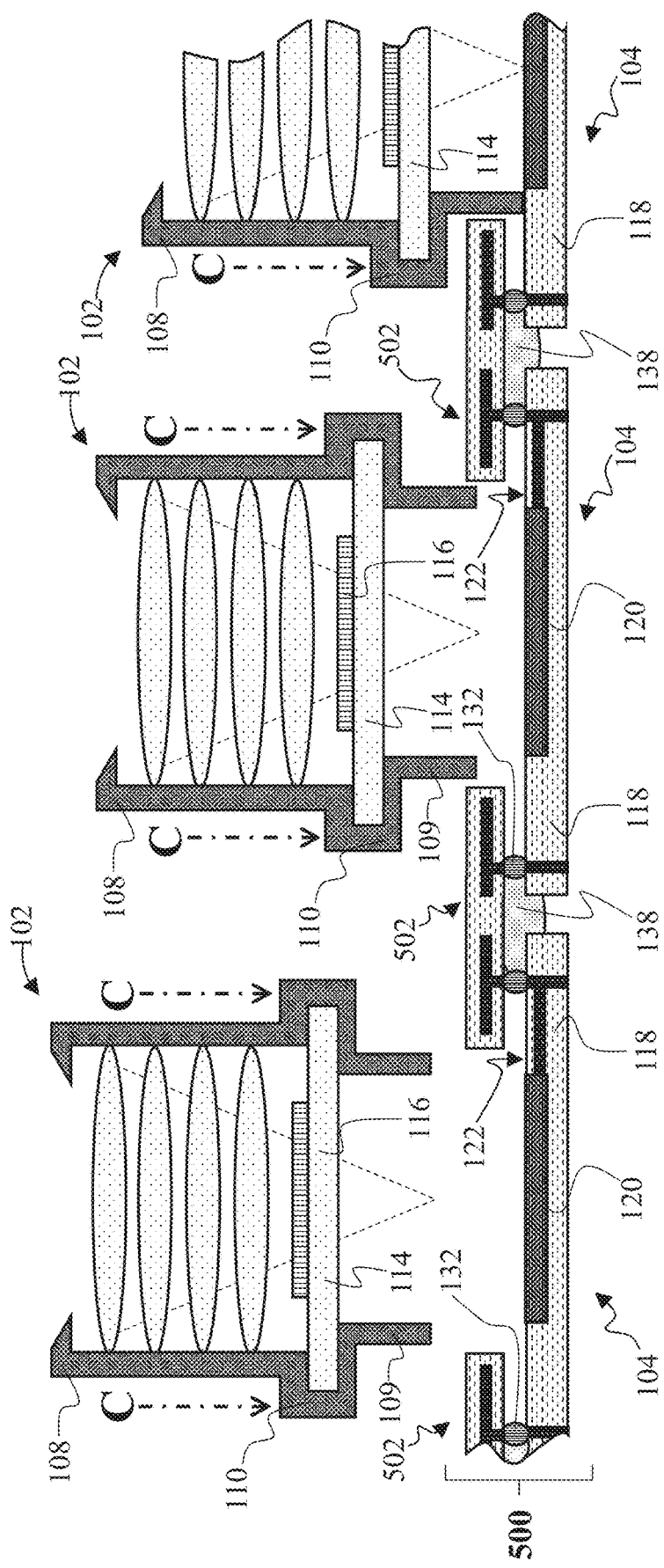

FIGS. 5A-5F depict an example of a method for manufacturing the optoelectronic module depicted in FIGS. 1A and 1B. As would be readily apparent to a person of ordinary skill in the art, the method is applicable to other optoelectronic modules such as the example modules depicted in FIG. 2-FIG. 4. FIG. 5A illustrates a series of first operations: A wafer assembly 500 is assembled by aligning an intermediate substrate wafer 502 having a plurality of the active optoelectronic components assemblies 104. A plurality of the electrical connections is established therebetween as indicated by dotted lines A. Establishing the plurality of the electrical connections can include soldering the electrical connections (e.g., soldered bumps) between the electrical components 130. In this example, the electrical components 130 included in the intermediate substrate wafer are in electrical communication with the plurality of active optoelectronic components 120.

As described above, the electrical connections 132 disposed between the intermediate substrate wafer and the plurality of active optoelectronic component assemblies can establish a plurality of base gaps, as illustrated in FIG. 5B. The base adhesive layer is introduced into the plurality of base gaps, as further illustrated in FIG. 5B by dotted lines B. In some instances, the wafer assembly 500 is subjected to thermal energy and/or electromagnetic radiation (e.g., infrared and/or ultraviolet light) to cure the base adhesive layer. As described above, the electrical connections 132 can be operable to delineate the base gap, wherein the base gap is configured to contain the base adhesive layer. The base gap can be tuned according to the viscosity of the base adhesive layer (e.g., in an uncured state) such that the base adhesive layer is contained and does not impinge on the active optoelectronic component 120.

In another operation, a plurality of the optical assemblies 102 are aligned with the plurality of active optoelectronic component assemblies 104, as depicted in FIG. 5C by broken lines C. In some instances, the intermediate substrate wafer 502 facilitates the lateral alignment of each of the optical assemblies 102.

Figure 5D:
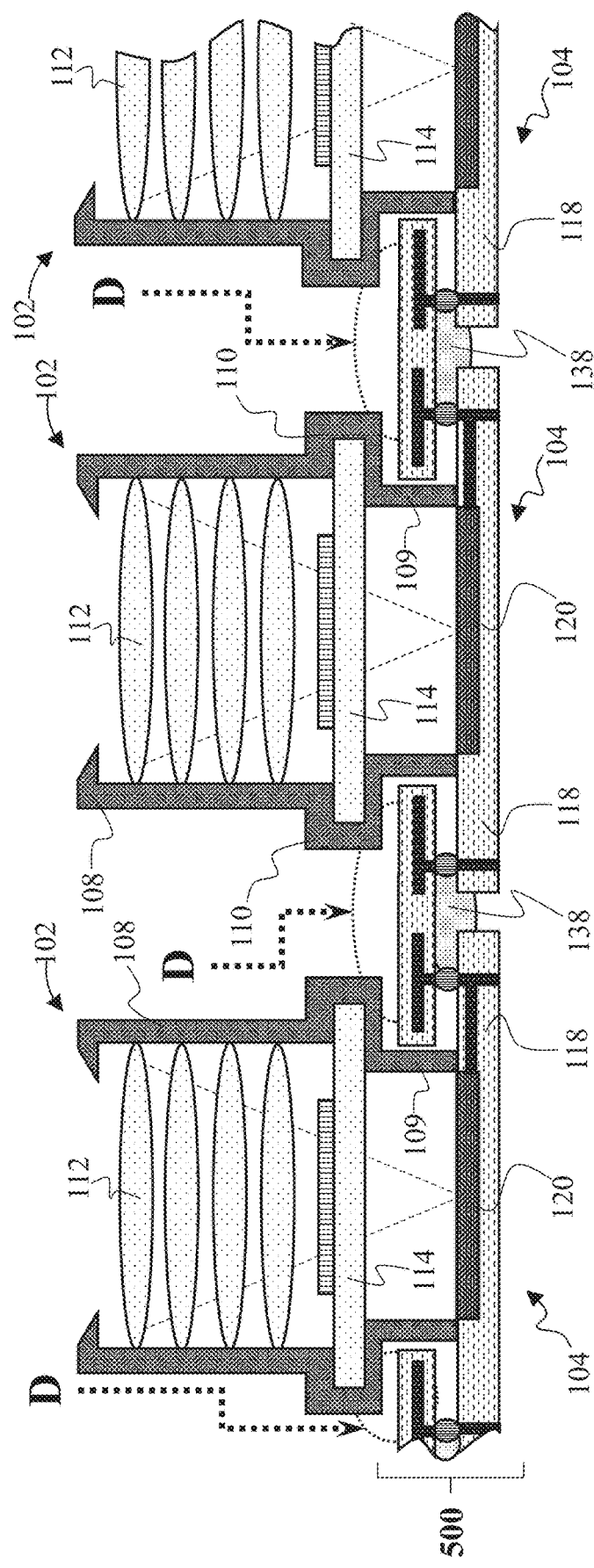

In another operation, the flange adhesive layer is introduced into the plurality of flange gaps, as illustrated in FIG. 5D by the dotted lines D. In some instances, the wafer assembly 500 is subjected to thermal energy and/or electromagnetic radiation (e.g., infrared and/or ultraviolet light) to cure the flange adhesive layer. As described above, the optical-alignment spacers 109 can be operable to delineate the flange gap, wherein the flange gap is configured to contain the flange adhesive layer. The flange gap can be tuned according to the viscosity of the flange adhesive layer (e.g., in an uncured state) such that the flange adhesive layer is contained and does not impinge on the the active optoelectronic component 120.

Figure 5E:
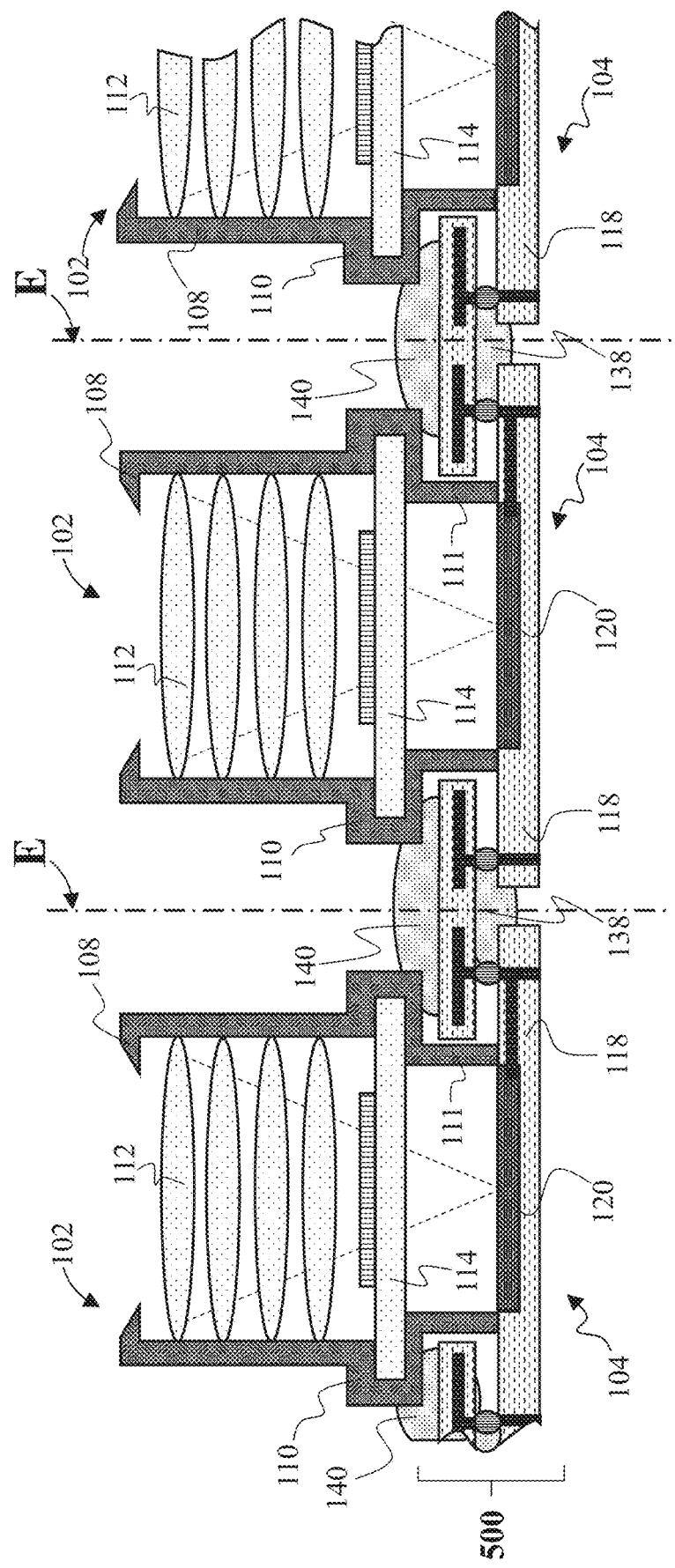
Figure 5F:
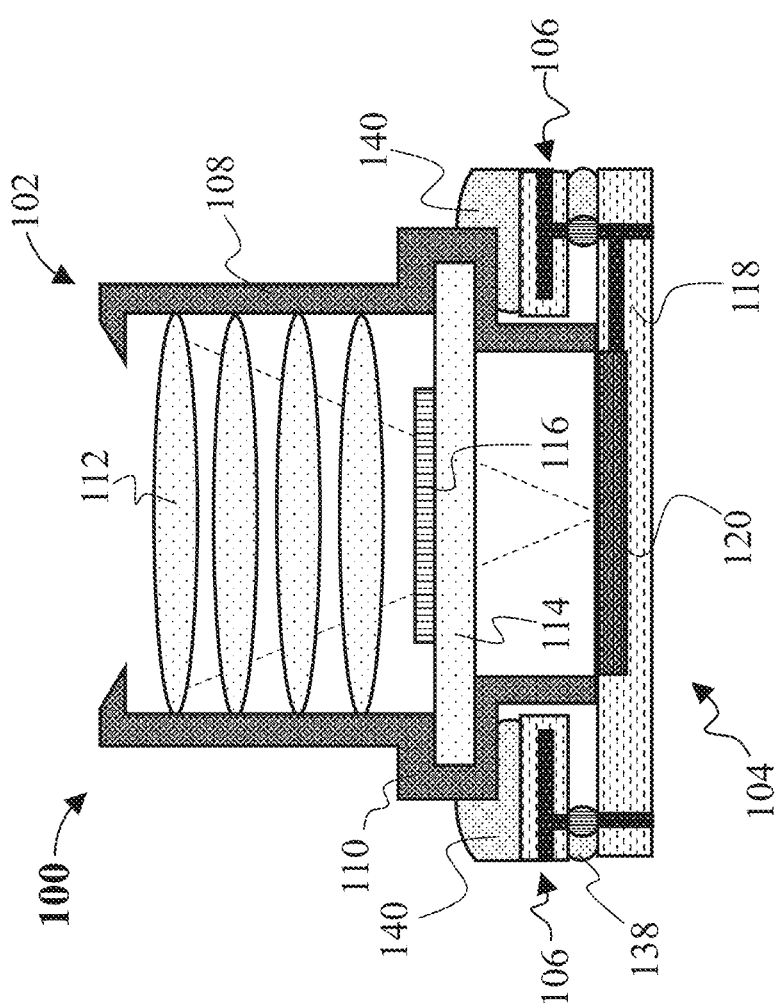

In another operation, the flange adhesive layer 140, the intermediate substrate wafer 502, and the base adhesive layer 138 are diced through along the broken lines E, as illustrated in FIG. 5E, forming a plurality of singulated optoelectronic modules 100. In some instances, the dicing can occur prior to introducing the flange adhesive layer. That is, the intermediate substrate wafer 500 and the base adhesive layer can be diced through, and then the flange adhesive layer can be introduce into the flange gap disposed between the intermediate substrate and the base substrate.

Other modifications may be made to the foregoing implementations, and features described above in different implementations may be combined in the same implementation. Thus, other implementations are within the scope of the claims.

What is claimed, is:
1. An optoelectronic module comprising:
an optical assembly, an active optoelectronic component assembly, and an intermediate substrate disposed therebetween;
the optical assembly includes an optical housing portion, an optical alignment spacer, and a flange portion disposed therebetween;
the optical housing portion includes at least one optical element disposed therein;
the active optoelectronic component assembly includes a base substrate and an active optoelectronic component disposed on a first side of the base substrate;
the intermediate substrate includes first and second sides, and the flange portion includes a first side;
the first side of the intermediate substrate being opposite the first side of the base substrate and being separated by a base gap;

the second side of the intermediate substrate being opposite the first side of the flange portion and being separated by a flange gap;

the active optoelectronic component assembly and the intermediate substrate include electrical components in electrical communication via at least one electrical connection disposed within the base gap;

a base adhesive layer extending circumferentially around the active optoelectronic component forming a continuous annulus and at least partially occupying the base gap, the base adhesive layer being operable to fix the active optoelectronic component assembly to the intermediate substrate; and a flange adhesive layer extending circumferentially around the active optoelectronic component forming a continuous annulus and at least partially occupying the flange gap, the flange adhesive layer being operable to fix the optical assembly to the intermediate substrate.

2. The optoelectronic module of claim 1, wherein the optical alignment spacer is in contact with the first side of the base substrate and is operable to align the optical assembly and the active optoelectronic component, and the optical alignment spacer is contiguous with the flange portion and is alongside the flange gap to delineate the flange gap.

3. The optoelectronic module of claim 2, wherein the at least one electrical connection is operable to delineate the base gap.

4. The optoelectronic module of claim 3, wherein the flange gap and the base gap are configured to contain the flange adhesive layer and the base adhesive layer, respectively, such that neither the flange adhesive layer nor the base adhesive layer impinge onto the active optoelectronic component.

5. The optoelectronic module of claim 4, further including at least one tilt correction spacer.

6. The optoelectronic module of claim 4, wherein the at least one electrical connection and/or the base adhesive layer includes a venting channel.

7. The optoelectronic module of claim 5, wherein the at least one electrical connection, the base adhesive layer, and/or the at least one tilt correction spacer includes a venting channel.

8. The optoelectronic module of claim 4, wherein the optical assembly further includes a cover glass.

9. The optoelectronic module of claim 8, wherein the optical assembly further includes a supplemental optical element disposed on a surface of the cover glass.

10. The optoelectronic module of claim 4, wherein the active optoelectronic component assembly further include a supplemental optical element disposed on the active optoelectronic component.

11. The optoelectronic module of claim 4, wherein the optical housing portion is fixed to the flange portion by a supplemental adhesive.

12. The optoelectronic module of claim 4, wherein the optical housing portion is fixed to the flange portion by threaded portions, the threaded portions being operable to actuate the optical housing portion to align the optical assembly with the active optoelectronic component.

13. The optoelectronic module of claim 4, wherein the active optoelectronic component includes a light-emitting component or a light-sensitive component.

14. The optoelectronic module of claim 4, wherein the at least one electrical connection includes a soldered connection.

* * * * *